United States Patent [19]

Ferguson, Jr.

[11] Patent Number: 5,363,102
[45] Date of Patent: Nov. 8, 1994

[54] OFFSET-INSENSITIVE SWITCHED-CAPACITOR GAIN STAGE

[75] Inventor: Paul F. Ferguson, Jr., Dracut, Mass.

[73] Assignee: Analog Devices, Inc., Norwood, Mass.

[21] Appl. No.: 37,300

[22] Filed: Mar. 26, 1993

[51] Int. Cl.⁵ .............................................. H03M 3/02
[52] U.S. Cl. .................................... 341/172; 341/143
[58] Field of Search ................... 341/143, 172; 330/9, 330/51

[56] References Cited

U.S. PATENT DOCUMENTS

| | | | |
|---|---|---|---|
| 4,325,055 | 4/1982 | Colardelle et al. | 341/172 |
| 4,574,250 | 3/1986 | Senderowicz | 330/258 |
| 4,803,462 | 2/1989 | Hester et al. | 341/172 |
| 5,057,839 | 10/1991 | Koch | 341/143 |
| 5,107,266 | 4/1992 | Kim | 341/163 |
| 5,148,167 | 9/1992 | Ribner | 341/143 |
| 5,177,484 | 1/1993 | Bruckmann | 341/172 |
| 5,220,286 | 6/1993 | Nadeem | 330/9 |

Primary Examiner—Marc S. Hoff
Attorney, Agent, or Firm—Parmelee, Bollinger & Bramblett

[57] ABSTRACT

An IC chip formed with an analog-to-digital converter having a switched-capacitor programmable gain stage and employing a switched-capacitor sigma-delta modulator. The chip includes pins to receive a number of different audio input signals which are selectively connectible to buffer amplifiers the outputs of which are directed to a switch to select one output for further processing. The selected buffer amplifier output is d-c coupled to an input signal terminal of a switched-capacitor programmable gain stage. The output of this gain stage is coupled to an output stage including an op-amp and associated switched-capacitor circuitry. The programmable gain stage has a reference input terminal which is connected through an IC chip pin to an external capacitor the other electrode of which is returned to signal common. This capacitor develops a d-c voltage corresponding to the offset voltages of the operative buffer amplifier and the op-amp, and including a component corresponding to charge-injection from MOS switches. Absorption of such d-c voltages by this capacitor prevents those voltages from being significantly gained by the amplifier circuitry, and thereby prevents those voltages from using up an excessive portion of the dynamic range of the circuitry.

39 Claims, 2 Drawing Sheets

OFFSET-INSENSITIVE SWITCHED-CAPACITOR GAIN STAGE

BACKGROUND OF THE INVENTION

1. Field of the Invention

This invention relates to switched-capacitor circuitry such as is found in sigma-delta analog-to-digital and digital-to-analog converters. More particularly, this invention relates to an IC chip having switched-capacitor circuitry provided with means to allow the circuit gain to be increased without increasing the magnitude of the d-c offset signal in the output.

2. Description of the Prior Art

Converters of the sigma-delta type have become quite popular for use in high performance audio systems. Among their many and varied applications, such converters have found considerable use in producing high-fidelity digital-audio signals to be supplied to personal computers (PCs) where the digital data may be processed (e.g., compressed), stored, and played back. It is important in such audio systems that the digital-audio signals be very precise representations of the original analog-audio signals, substantially free of distortion. This capability is a feature of ADCs employing switched-capacitor circuitry and sigma-delta modulation. Such audio systems also commonly make use of DACs as well as ADCs employing switched-capacitor circuitry and sigma-delta modulation.

The amplifiers in the signal chain of such a high quality sound system should be arranged so that the amplifier d-c offset signals, and any other unwanted d-c signals, are not gained along with the digital sound signals. Otherwise, such d-c signals can use up an excessive portion of the dynamic range of the circuitry, and prevent satisfactory operation at high gain settings due to saturation.

Avoiding such gaining of the offset and other d-c signals can be achieved by the use of a-c coupling capacitors. However, it has been found that such a-c coupling must be incorporated in switched-capacitor circuitry in a special way to avoid problems in practical usage.

One problem stems from the fact that the coupling capacitor must be relatively large, and for that reason should be located off-chip. Thus, if the circuit arrangement provides simply that the coupling capacitor be in series with the internal signal path on the chip, as might be thought proper where multiple audio inputs must be served, it would be necessary to provide additional pins on the IC chip to make electrical connections between the capacitor and the circuit nodes to which the capacitor is to be connected. This adds significant expense to the manufacture of the IC part.

Still other practical problems are encountered in designing the converter circuitry to achieve the desired results. For example, the input circuitry of the converter desirably should include one and preferably more buffer amplifiers preceding the switched-capacitor circuitry forming part of the converter, and the d-c coupling of such buffer amplifiers can cause harmful interaction with gain-adjustment circuitry following the buffer amplifier. The design should accommodate the use of buffer amplifiers without adverse d-c offset signal effects from interaction with the following circuitry.

SUMMARY OF THE INVENTION

In a preferred embodiment of the invention, to be described below in detail, there is provided an IC chip having the usual array of connection pins wherein one set of pins is designated to receive the various audio input signals. These signals are selectively switchable within the chip to a buffer amplifier (and in the preferred configuration, alternatively to a second buffer amplifier) driving a signal line leading to the signal input terminal of a switched-capacitor programmable gain stage (PGS). This PGS also has a reference signal input terminal, and with an audio signal across the two input terminals, the PGS supplies corresponding amplified signals to a sigma-delta modulator which produces a stream of binary bits in the usual sigma-delta fashion.

The reference signal input terminal of the PGS is connected directly to a corresponding reference pin of the IC chip and this pin in turn is connected externally of the chip to one electrode of a large capacitor. The other electrode of this capacitor is connected in the preferred embodiment to system common (which may be actual ground or any fixed d-c signal in some configurations). With this arrangement, unwanted d-c voltages (corresponding to offset voltages, etc.) of the buffer amplifier and the following amplifier circuitry will appear across the external capacitor. Thus, when the gain of the PGS is increased, the offset component of the converter output will remain constant so as not to significantly affect the converter performance.

One important advantage of this arrangement is that connection to an external capacitor for isolating the d-c offset signal is effected without requiring any additional pins for the IC chip unless multiple channels are provided. And, although several different audio inputs are provided for as well as one or more buffer amplifiers, and still further amplification for the sigma-delta modulator, there is need for only a single large coupling capacitor for absorbing all of the unwanted d-c voltages.

Other objects, aspects and advantages of the invention will in part be pointed out in, and in part apparent from, the following description of a preferred embodiment considered together with the accompanying drawing.

BRIEF DESCRIPTION OF THE DRAWING

The single drawing (FIGS. 1A and 1B) shows a circuit diagram, partly in block format, of an analog-to-digital converter formed as part of an IC chip.

DETAILED DESCRIPTION OF A PREFERRED EMBODIMENT

Figure 1A:
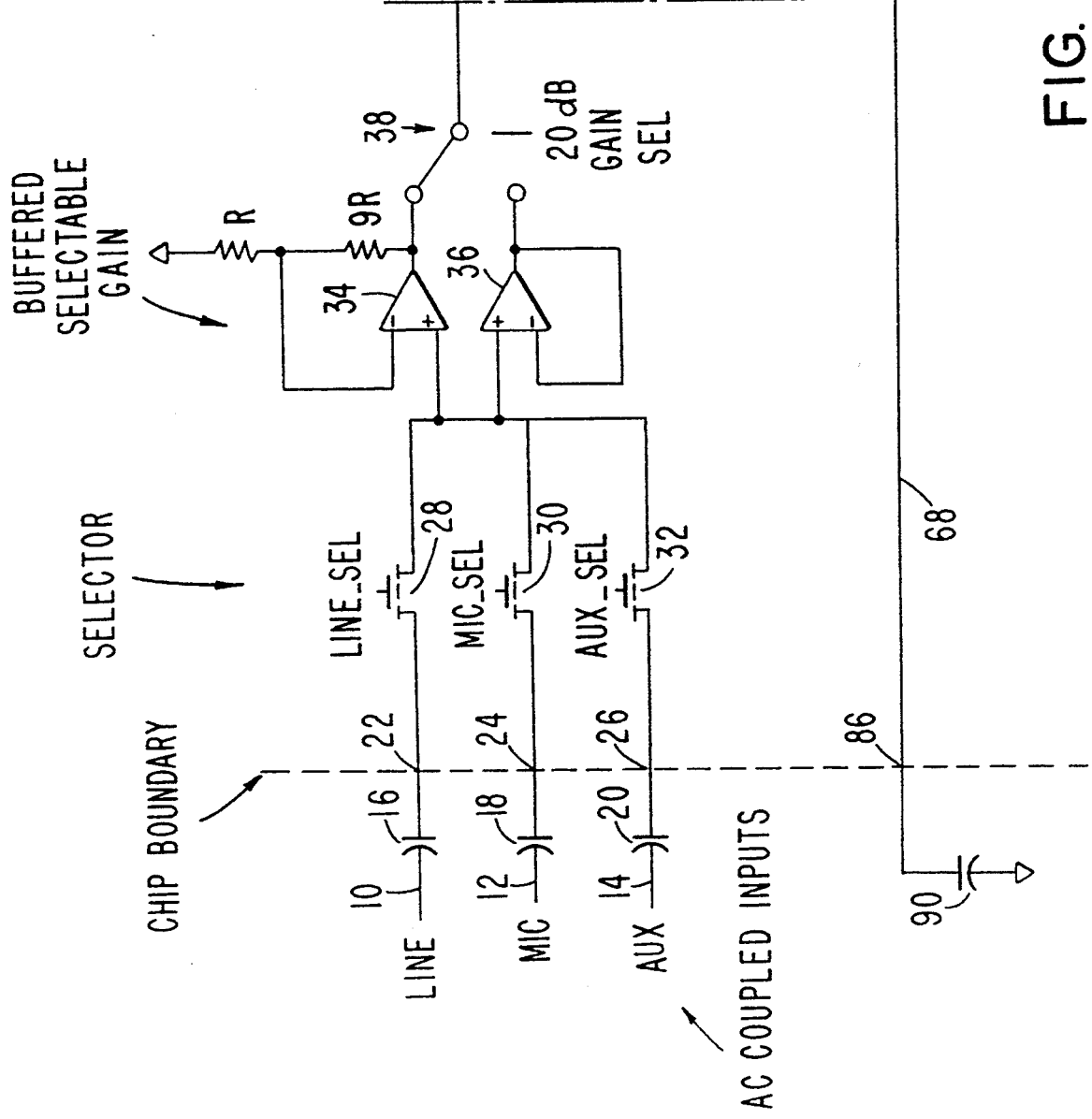
Figure 1B:
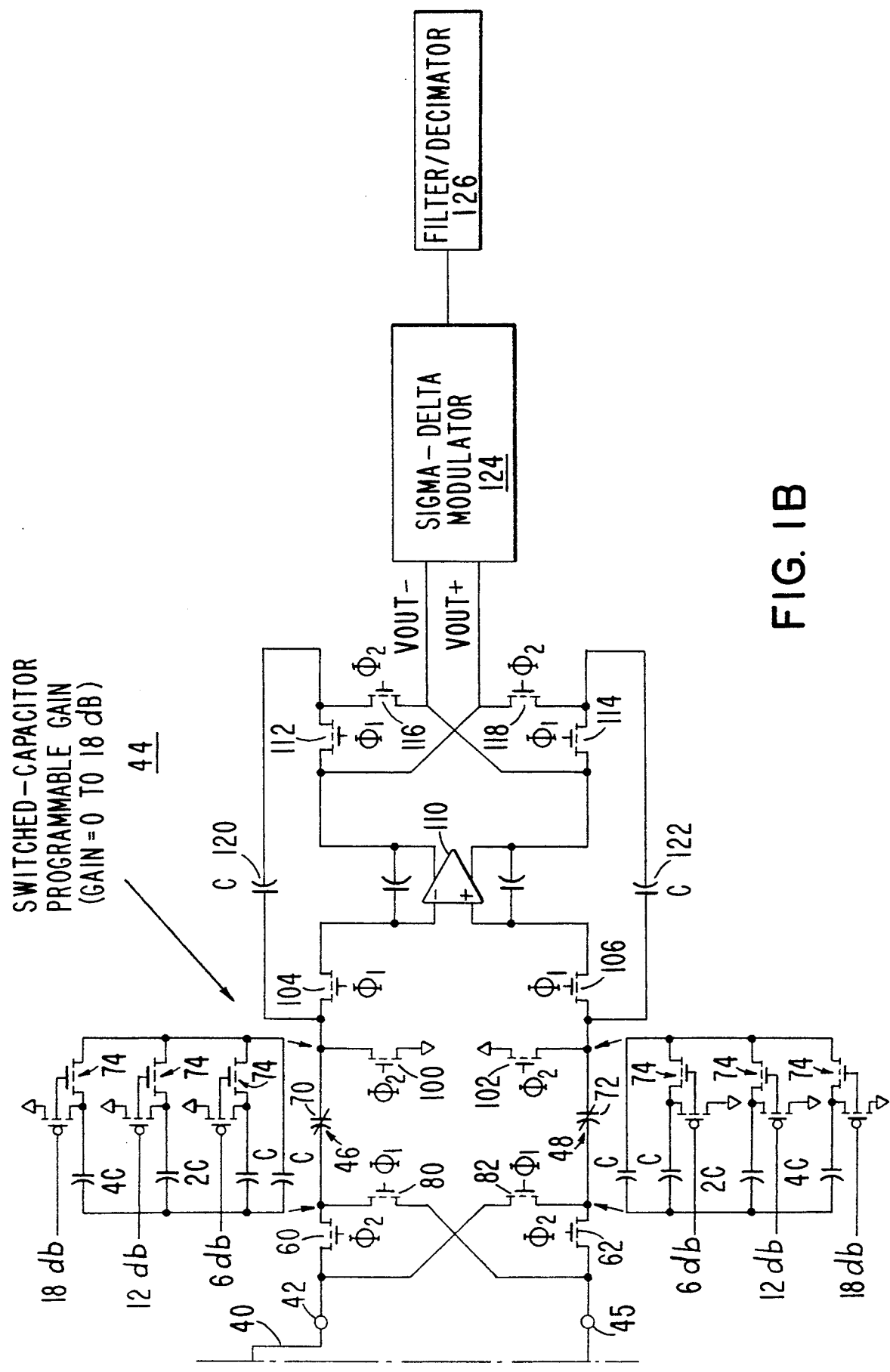

Referring now to the drawing, the schematic diagram shows switched-capacitor circuitry forming part of an integrated-circuit (IC) chip adapted to be incorporated in a high-fidelity sound system such as one where the digitized sound signals are directed to a PC for processing and/or storage and playback. The circuitry shown has been somewhat simplified from that which would be employed in a commercial system, in order to avoid undue complexity which could interfere with understanding the operation of the circuit.

Turning first to the left-hand edge of the drawing, there are shown three input lines 10, 12, 14 carrying audio signals. The three lines shown are described using audio terminology as "Line", "Mic" (for microphone) and "Aux" (which could be a CD player or the like).

Still other audio inputs could be provided. These audio lines are coupled through capacitors 16, 18, 20 to corresponding pins of the IC chip which are not shown pictorially but are identified by reference numbers 22, 24, 26.

Within the chip, these pins are connected to corresponding selector switches 28, 30, 32 arranged to connect the audio signals at any of the pins to the inputs of two buffer amplifiers 34, 36. The lower amplifier provides zero db gain (1:1 ratio) while the upper amplifier provides a gain of 20 db (10:1 ratio).

The outputs of amplifiers 34, 36 are connected to a selector switch 38, and the selected signal is connected to an audio signal line 40. This line is connected to one input terminal 42 of the input circuit of a switched-capacitor programmable-gain stage (PGS) generally indicated at 44. The input circuit has a second input terminal 45 which will be discussed further below. This switched-capacitor circuitry 44 is of balanced configuration, and includes two parallel signal paths generally indicated at 46, 48.

The input circuit for this switched-capacitor circuitry 44 includes clocked switches 60, 62 which are closed together at clock times indicated as $\phi_2$. The audio signal line 40 is connected through input terminal 42 to the input node of the upper switch 60. The other input terminal 45 is connected to the input node of the lower switch 62, and also is connected to a reference signal line 68 which will be further described.

Controllable capacitors 70, 72 are in series with the balanced signal paths 46, 48. Each of these capacitors may for example be made up of a combination of a selectable series of capacitors (shown as C, C, 2C, 4C arranged in a ladder configuration). In the capacitor selection circuitry shown, the ladder capacitors are connectible into the circuit under the control of logic signals applied to switch sets 74. Each switch set can either connect the corresponding capacitor (C, 2C etc.) in parallel to form the illustrated capacitor 70 or 72, or can shunt the corresponding capacitor to the system common. Thus the total capacitance can be varied from C to 8C, and will correspondingly alter the effective gain of the circuitry.

The input signal circuit of the switched-capacitor circuitry 44 includes a cross-over connection between each input terminal 42 (or 45) in one signal path 46 (or 48) and the output node of the series switch 62 (or 60) in the other signal path 48 (or 46). These cross-over connections include clocked switches 80, 82 which are closed together at times indicated as $\phi_1$. The clock timing is such that $\phi_1$ and $\phi_2$ do not overlap. In effect, the voltages at the audio signal line 40 and the reference signal line 68 are alternatingly applied to the left-hand electrodes of the capacitors 70, 72 providing what may be considered a double-differential effect.

The reference signal line 68 is connected at the IC chip boundary to a corresponding pin 86 on the chip. This pin, in turn, is connected to a relatively large (1 $\mu$f) external capacitor 90 to the common bus (shown as a ground symbol for the overall system, where the system typically includes other components such as a PC). Since no d-c current can flow through this external capacitor, the voltage on the capacitor ultimately will stabilize at a d-c level at which it equals the d-c input value on the upper input terminal 42 added to other unwanted d-c signals. The d-c voltage at terminal 45, in turn, represents the accumulated unwanted d-c signals including the offset of the buffer amplifier as it appears at the amplifier output, the charge-injection from the MOS switches used in the switched-capacitor circuitry, and any other possible reflected equivalent offset voltage from other amplifiers in the circuitry.

At the right-hand terminals of the series capacitors 70, 72, there is another pair of switches 100, 102, which are clocked at $\phi_2$ to connect those terminals to system common. Those capacitor terminals also are coupled to further amplification circuitry through $\phi_1$ clocked switches 104, 106 leading to the input terminals of an op-amp 110. The output of that amplifier drives a further clocked switch network including series $\phi_1$ switches 112, 114, and cross-over $\phi_2$ switches 116, 118. Feedback capacitors 120, 122 couple the output nodes of the series switches 112, 114 back to the input nodes of the input series switches 104, 106. This arrangement produces a d-c output signal on the input nodes of the output series switches 112, 114, and identified as $V_{OUT}-$ and $V_{OUT}+$.

This d-c output signal is, in this embodiment, directed to the input of a sigma-delta switched capacitor modulator circuit generally indicated at 124. The digital output of this modulator circuit is directed to a low-pass filter/decimator circuit generally indicated at 126, to produce a digital output signal corresponding to the original input analog signal.

A d-c voltage corresponding to the d-c offset signal of the amplifier 110 will, in the arrangement described, ultimately appear at the external capacitor 90. Such d-c voltages collected at that capacitor will however not be gained by the amplification circuitry, and therefore such d-c signals will be prevented from interfering with the dynamic range of the switched-capacitor circuitry.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. An a-c gain circuit for use as part of signal-processing means to be incorporated in a system having a signal common and comprising:
   an IC chip including:
   an input signal line;
   a reference signal line;
   switched-capacitor circuitry having an input signal circuit and an output signal circuit, said input signal circuit including two input terminals, one of said input terminals being connected to said input signal line and the other being connected to said reference signal line;
   amplifier means coupled to one of said signal circuits to provide amplification of signals passing through said switched-capacitor circuitry; and
   a capacitor fixedly connected through a non-switched connection between said reference signal line and signal common.

2. Apparatus as claimed in claim 1, including an input signal selection circuit having a plurality of input lines respectively connected to a set of first IC pins connectible to different input signal sources;
   said input signal line being arranged to be coupled to any of said set of first IC pins.

3. Apparatus as claimed in claim 2, wherein said amplifier means comprises at least one buffer amplifier having its input coupled to any of said set of first IC pins and supplying a signal to said input signal line.

4. Apparatus as claimed in claim 3, wherein said amplifier means comprises at least two buffer amplifiers of differing gains and with their inputs selectively connectible to said set of first IC pins;
said amplifiers producing outputs selectably connectible to said input signal line.

5. Apparatus as claimed in claim 1, wherein said amplifier means comprises an amplifier forming part of an output stage which is coupled to said output signal circuit for said switched-capacitor circuitry.

6. Apparatus as claimed in claim 5, wherein said output stage is a balanced circuit having first and second input terminals and first and second clocked switches coupled to said output stage input terminals respectively.

7. Apparatus as claimed in claim 6, wherein said output stage clocked switches have input and output nodes, said amplifier having first and second input terminals coupled to output nodes of said output stage clocked switches respectively.

8. Apparatus as claimed in claim 5, wherein said output stage comprises switched-capacitor output circuitry producing an output signal corresponding to the signal from the selected audio signal source.

9. Apparatus as claimed in claim 8, including a sigma-delta modulator stage having its input coupled to receive said output signal.

10. Apparatus as claimed in claim 9, wherein said modulator stage is of the switched-capacitor type.

11. Apparatus as claimed in claim 9, wherein the output of said modulator output is coupled to a filter/decimator.

12. Apparatus as claimed in claim 1, wherein said a-c gain circuit comprises means to change the gain.

13. Apparatus as claimed in claim 12, wherein said gain changing means comprises a plurality of capacitors selectively connectable into said circuit.

14. Apparatus as claimed in claim 1, wherein said capacitor is connected between a pin of said IC chip and system common, externally of said chip.

15. Analog-to-digital conversion means for use as part of signal-processing means incorporated in a system having a signal common and comprising an IC chip for converting analog input signals to corresponding digital signals to be directed to a digital signal processing and/or storage device of said system;
said IC chip including:
an input signal selection circuit having a plurality of input lines respectively connectible to different input signal sources;
at least one buffer amplifier having an output signal line;
switch means for coupling any one of said input signals to the input of said buffer amplifier;
a reference signal line;
a switched-capacitor circuit having two input terminals, one of said terminals being connected to said output signal line and the other being connected to said reference signal line; and
a capacitor fixedly connected through a non-switched connection between said reference signal line and signal common.

16. Apparatus as claimed in claim 15, including two buffer amplifiers providing different gains; and second switch means for selecting the output of either of said buffer amplifiers and for connecting the selected output through said output signal line to said one terminal of said switched-capacitor circuit.

17. Apparatus as claimed in claim 16, wherein said first switch means provides for selectable connection of said input signal sources to both of said buffer amplifiers.

18. Apparatus as claimed in claim 16, wherein said switched-capacitor circuitry is a balanced circuit having two parallel signal paths;
means coupling said two input terminals to said parallel signal paths respectively;
first and second controllable capacitors in series with said signal paths respectively; and
means for programming the magnitudes of said controllable capacitors to provide for correspondingly altering the gain of said switched-capacitor circuitry.

19. Apparatus as claimed in claim 18, including first and second clocked switches in series with each of said signal paths, each switch having input and output nodes with the input nodes being coupled to said input terminals respectively and said output nodes being coupled to said controllable capacitors respectively.

20. Apparatus as claimed in claim 19, including first and second cross-over circuits each coupled between a respective one of said input terminals in one of said signal paths and the output node of the clocked switch in the other signal path.

21. Apparatus as claimed in claim 15, including an output stage coupled to the output of said switched-capacitor circuitry.

22. Apparatus as claimed in claim 21, wherein said output stage comprises amplifier means.

23. Apparatus as claimed in claim 22, wherein said output stage includes a balanced circuit having first and second input terminals and first and second clocked switches coupled to said input terminals respectively.

24. Apparatus as claimed in claim 23, wherein said output stage clocked switches have input and output nodes, said amplifier means having first and second input terminals coupled to the output nodes of said output stage clocked switches.

25. Apparatus as claimed in claim 21, wherein said output stage comprises switched-capacitor circuitry producing an output signal corresponding to the signal from the selected input signal source.

26. Apparatus as claimed in claim 25, including a sigma-delta modulator stage having its input receiving said output signal.

27. Apparatus as claimed in claim 26, wherein said modulator stage is of the switched-capacitor type.

28. Apparatus as claimed in claim 27, wherein the output of said modulator is coupled to a filter/decimator.

29. An a-c gain circuit for use as part of signal-processing means to be incorporated in a system having a signal common and comprising:
(1) an IC chip including:
an input signal selection circuit having a plurality of input lines respectively connectible to different input signal sources;
an input signal line;
a reference signal line;
switched-capacitor circuitry having an input signal circuit and an output signal circuit, said input signal circuit including two input terminals;

means coupling said two input terminals to said input signal line and to said reference signal line respectively;

amplifier means coupled between said input signal circuit and said output signal circuit to provide amplification of the signals passing through said switched-capacitor circuitry; and (2) a capacitor fixedly connected through non-switched circuitry between said reference signal line and signal common.

30. Apparatus as claimed in claim 29, wherein said switched-capacitor circuit is a balanced circuit having first and second clocked switches coupled to said two input terminals respectively.

31. Apparatus as claimed in claim 30, wherein said clocked switches have input and output nodes, said amplifier having first and second input terminals coupled to the output nodes of said clocked switches respectively.

32. Apparatus as claimed in claim 31, wherein said output signal circuit includes switched-capacitor output circuitry producing an output signal corresponding to the signal from the selected input signal source.

33. Apparatus as claimed in claim 32, including a sigma-delta modulator stage having its input receiving said output signal.

34. Apparatus as claimed in claim 33, wherein said modulator stage is of the switched-capacitor type.

35. Apparatus as claimed in claim 34, wherein the output of said modulator is coupled to a filter/decimator.

36. In an a-c gain circuit for use as part of signal-processing means to be incorporated in a system having a signal common, and wherein the gain circuit comprises an IC chip providing an input signal line and a reference signal line to direct an input signal carried on an input signal line and a reference signal line to the input signal circuit of switched-capacitor gain circuitry having first and second input terminals to be connected to said input signal line and reference signal line respectively, said switched-capacitor gain circuitry having an output signal circuit, the a-c gain circuit including amplifier means connected to one of said signal circuits;

the method of reducing the effect of unwanted d-c signals on the performance of the a-c gain circuit comprising the steps of:

developing on a capacitor a voltage corresponding to said unwanted d-c signals; and coupling said capacitor between said reference signal line and said system common to prevent introducing said unwanted d-c signals into the gain of said a-c gain circuit.

37. The method of claim 36, wherein said capacitor is coupled between a pin of said IC chip and said system common externally of said chip.

38. The method of claim 36, wherein said gain-changing means is operable to alter the gain of said a-c gain stage.

39. The method of claim 38, wherein said gain-changing is effected by selectively coupling one or more of a plurality of switch-controlled capacitors into said gain stage.

* * * * *